United States Patent
Kato (10) Patent No.: US 6,428,888 B1
(45) Date of Patent: Aug. 6, 2002

(54) CONNECTION TAPE FOR SQUARE HOLE PUNCH CARRIER TYPE TAPING AND METHOD OF MANUFACTURING CONNECTION TAPE

(75) Inventor: Teruyuki Kato, Osaka (JP)

(73) Assignee: Kabushiki Kaisha Kato Seiko, Osaka (JP)

( * ) Notice: Subject to any disclaimer, the term of this patent is extended or adjusted under 35 U.S.C. 154(b) by 0 days.

(21) Appl. No.: 09/674,831

(22) PCT Filed: Apr. 5, 1999

(86) PCT No.: PCT/JP99/01804

§ 371 (c)(1),
(2), (4) Date: Nov. 7, 2000

(87) PCT Pub. No.: WO00/59799

PCT Pub. Date: Oct. 12, 2000

(51) Int. Cl.[7] ............................. B65D 73/02; C09J 7/02; B32B 7/12
(52) U.S. Cl. ...................... 428/343; 428/354; 428/194; 428/40.1; 156/157; 156/505
(58) Field of Search ................................. 428/343, 354, 428/194, 40.1; 156/505, 157

(56) References Cited

U.S. PATENT DOCUMENTS 2,994,362 A * 8/1961 Hall
3,634,171 A * 1/1972 Rosborough, Jr. .......... 156/506
3,914,491 A * 10/1975 Takahashi ................... 428/137
4,390,389 A * 6/1983 Bunas et al. ................ 156/502
5,643,401 A * 7/1997 Schulze-Kahalyss et al. .... 156/505

FOREIGN PATENT DOCUMENTS

| JP | 4201871 | 7/1992 |
| JP | 4279465 | 10/1992 |

* cited by examiner

Primary Examiner—Daniel Zirker
Assistant Examiner—Victor S. Chang
(74) Attorney, Agent, or Firm—Armstrong, Westerman & Hattori, LLP (57) ABSTRACT

A connection tape (20) for connecting ends of square hole-punched carrier tapes (1) each of which comprises a carrier tape (11) formed with sprocket holes (11a) and pocket holes (11b), a top cover tape (12) and a bottom cover tape (13) attached on its top and bottom surfaces, respectively. The connection tape has a three-layer structure comprising a base tape (30), an adhesive tape (40) and a protection tape (50). The adhesive tape is composed of a first adhesive tape (41) which can adhere to the top cover tape, a second adhesive tape (42) which can adhere over the top of the sprocket holes in the carrier tape without interfering with the top cover tape, and a third adhesive tape (43) which can attach to the bottom cover tape. The second adhesive tape has sprocket holes (42a) which correspond to the sprocket holes in the square hole-punched carrier tape.

3 Claims, 6 Drawing Sheets

CONNECTION TAPE FOR SQUARE HOLE PUNCH CARRIER TYPE TAPING AND METHOD OF MANUFACTURING CONNECTION TAPE

TECHNICAL FIELD

The present invention relates to a connection tape for square hole-punched carrier tapes used in taping of surface mount electronic components, the connection tape being capable of connecting ends of square hole-punched carrier tapes in a simple and reliable manner, and a method for efficient manufacture of the connection tape.

BACKGROUND ART

Figure 7:
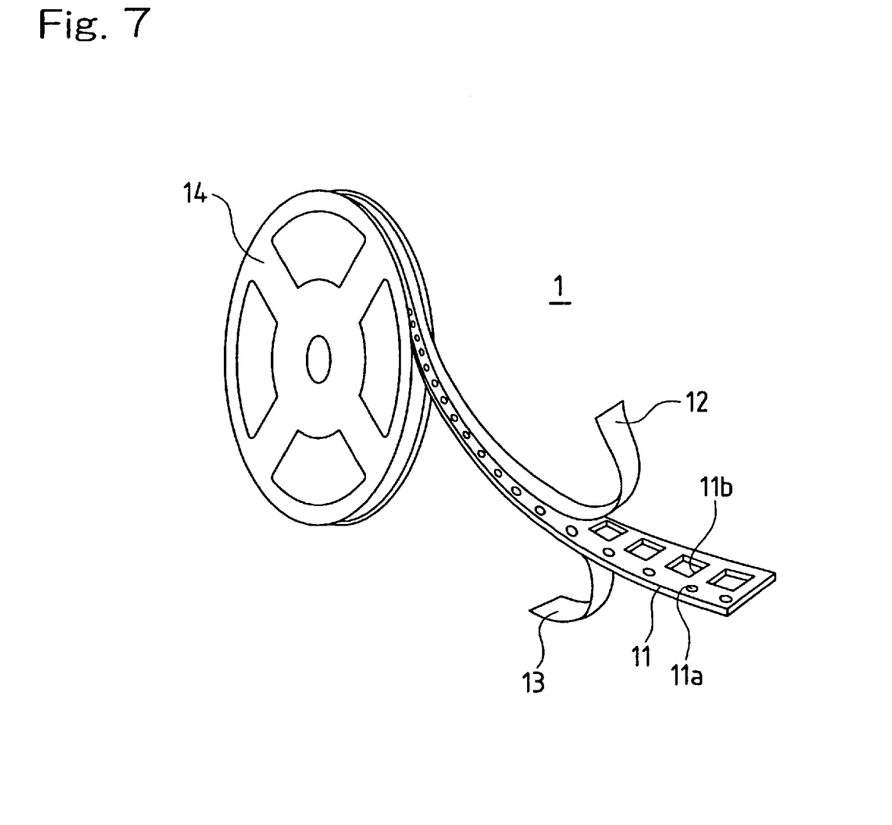
FIG. 7 is a perspective view showing the composition of a conventional and general square hole-punched carrier tape.

According to conventional technologies, as shown in FIG. 7 and FIGS. 8(a), (b), electronic components to be surface mounted on a printed circuit board, such as resistors and capacitors, are generally taped on a square hole-punched carrier tape 1 in order to be supplied to an automatic mounting device.

This square hole-punched carrier tape 1 comprises a paper or plastic carrier tape 11 which includes sprocket holes 11a at a predetermined sprocket hole pitch and square pocket holes 11b at a predetermined pocket hole pitch, a top cover tape 12 adhered to cover the top of the pocket holes 11b without obstructing the sprocket holes 11a, and a bottom cover tape 13 adhered to cover the bottom of the pocket holes 11b. Each pocket hole 11b in the carrier tape 11 stores a surface mount component such as a capacitor (not shown) in consideration of its polarity and the like, with the component covered by the top cover tape 12 and the bottom cover tape 13 which are adhered over the top and bottom of the pocket holes 11b, respectively. In a mounting operation, the square hole-punched carrier tape 1, wound on a reel 14, is unwound from the reel 14 to be supplied to an automatic mounting device. While the top cover tape 12 is gradually peeled off from the carrier tape 11, the surface mount component stored in each pocket hole 11b is taken out by suction, etc. and mounted on the surface of a printed circuit board.

Thus, this type of square hole-punched carrier tape 1 is wound on and reeled out from the reel 14. The square hole-punched carrier tape 1 which has a predetermined length should be replaced with a new square hole-punched carrier tape 1, once a prescribed number of surface mount components have been mounted. Replacement of the used square hole-punched carrier tape 1 with a new one interrupts the mounting operation by the automatic mounting device, and seriously deteriorates its operational efficiency.

To cope with this problem, it has been proposed to connect the trailing end of a used square hole-punched carrier tape 1 to the leading end of a new square hole-punched carrier tape 1 by means of a synthetic resin adhesive tape, etc. Nevertheless, the adhesive tape fails to attach securely to both ends of the used and new cover tapes 12, or the adhesive tape sticks not only to the top cover tape 12 but also to the carrier tape 11. These incidents cause the top cover tape 12 to peel badly or the sprocket holes 11a to be blocked by the adhesive tape, ending in hindering the supply of the square hole-punched carrier tapes 1. Thus, there have been a lot of demands for a simple and reliable connection means which does not prevent smooth supply of the square hole-punched carrier tape 1.

In view of such circumstances, the present invention intends to provide a connection tape for square hole-punched carrier tapes which is capable of connecting used and new square hole-punched carrier tapes in a simple and reliable manner, without preventing smooth supply of the square hole-punched carrier tapes, and a rational method for manufacturing the connecting tapes.

DISCLOSURE OF THE INVENTION

A connection tape for square hole-punched carrier tapes (hereinafter simply called as connection tape) is used to connect the ends of the above-mentioned square hole-punched carrier tapes. The connection tape comprises a base tape whose top surface is subjected to a mold release treatment and which is provided with a slit extending approximately in a middle thereof and dividing the tape in half in the longitudinal direction, an adhesive tape whose bottom surface is an adhesive surface and which is adhered on the top surface of the base tape by the adhesive surface, and a protection tape whose bottom surface is an adhesive surface and which is adhered on the top surfaces of the base tape and the adhesive tape by the adhesive surface. At least the protection tape has a fold line which divides its width in half. The adhesive tape comprises a first adhesive tape which can adhere to the top cover tape, a second adhesive tape which can adhere over the top of the sprocket holes in the carrier tape without interfering with the top cover tape, and a third adhesive tape which can adhere to the bottom cover tape. The first adhesive tape and the second adhesive tape are disposed in a first half as sectioned by the fold line, with the second adhesive tape being closer to the fold line, and the third adhesive tape locates in line symmetry with the first adhesive tape about the fold line. At least the second adhesive tape includes a plurality of sprocket holes whose pitch and diameter is the same as that of the sprocket holes in the square hole-punched carrier tape.

Since this connection tape allows each half of the base tape to be peeled separately, the first halves and second halves of the first adhesive tape and the second adhesive tape can be sequentially attached on the top surfaces of the used and new square hole-punched carrier tapes. The third adhesive tape can be then attached to the bottom surfaces of the used and new square hole-punched carrier tapes by folding back the protection tape. Eventually, a pair of used and new square hole-punched carrier tapes are connected in a simple and reliable manner. Also, due to the second adhesive tape having the sprocket holes, the used and new square hole-punched carrier tapes, when connected, have their sprocket holes aligned in accurate continuation. Therefore, the used and new square hole-punched carrier tapes can be supplied in the connected state to the automatic mounting device, etc., without any incidence of trouble.

Besides, the first adhesive tape, the second adhesive tape and the third adhesive tape are attached to the top cover tape, the carrier tape and the bottom cover tape, respectively, in an independent and non-interfering manner. This helps to retain stable adhesion of the carrier tape to the top cover tape and the bottom cover tape. In a mounting operation, when the top cover tape and the bottom cover tape are peeled off from the carrier tape, they peel well without causing peeling failure at a connection point.

Additionally, in the connection tape of the present invention, a peeling portion subjected to a non-adhesion treatment is provided in a part of the vicinity of each end of the protection tape. Consequently, the protection tape can be easily peeled off after the adhesive tape is attached across the used and new square hole-punched carrier tapes.

In another aspect, the method for manufacturing connection tapes of the present invention comprises: a step of providing a long base tape whose top surface is subjected to a mold release treatment and which is provided with a slit dividing its width in half, adhering an adhesive surface of a long adhesive tape to the top surface of the long base tape, punching the long adhesive tape to give profiles of a first adhesive tape, a second adhesive tape and a third adhesive tape which together constitute an adhesive tape of the connection tape, and peeling off each punched scrap; a step of adhering an adhesive surface of a long protective tape on a top surface of a resulting two-layer continuous strip composed of the long base tape and the punched adhesive tape in order to form a three-layer continuous strip, punching the three-layer continuous strip to give a plurality of sprocket holes for the connection tape which penetrate at a position corresponding to the second adhesive tape, a plurality of perforations as a fold line of the connection tape and a plurality of perforations as a cut-off line between connection tapes, and removing scraps of the sprocket holes; and a step of cutting a resulting long continuous strip of connection tapes into a unit of predetermined. pieces of connection tapes to produce connection tapes in the form of a continuous sheet. This results in continuous and efficient manufacture of the connection tapes of the present invention.

BRIEF DESCRIPTION OF THE DRAWINGS

FIGS. 8(a), (b) are a fragmentary plan view (partly omitted) and an end view, respectively, of the composition of the above square hole-punched carrier tape.

BEST MODE FOR CARRYING OUT THE INVENTION

Referring to the attached drawings, the best mode for carrying out the present invention is hereinafter described in detail. It should be understood that the square hole-punched carrier tape 1 shown in FIG. 7 and FIGS. 8(a), (b) has the same composition and each part thereof is referred to by the same names and reference signs as mentioned above.

Figure 1:
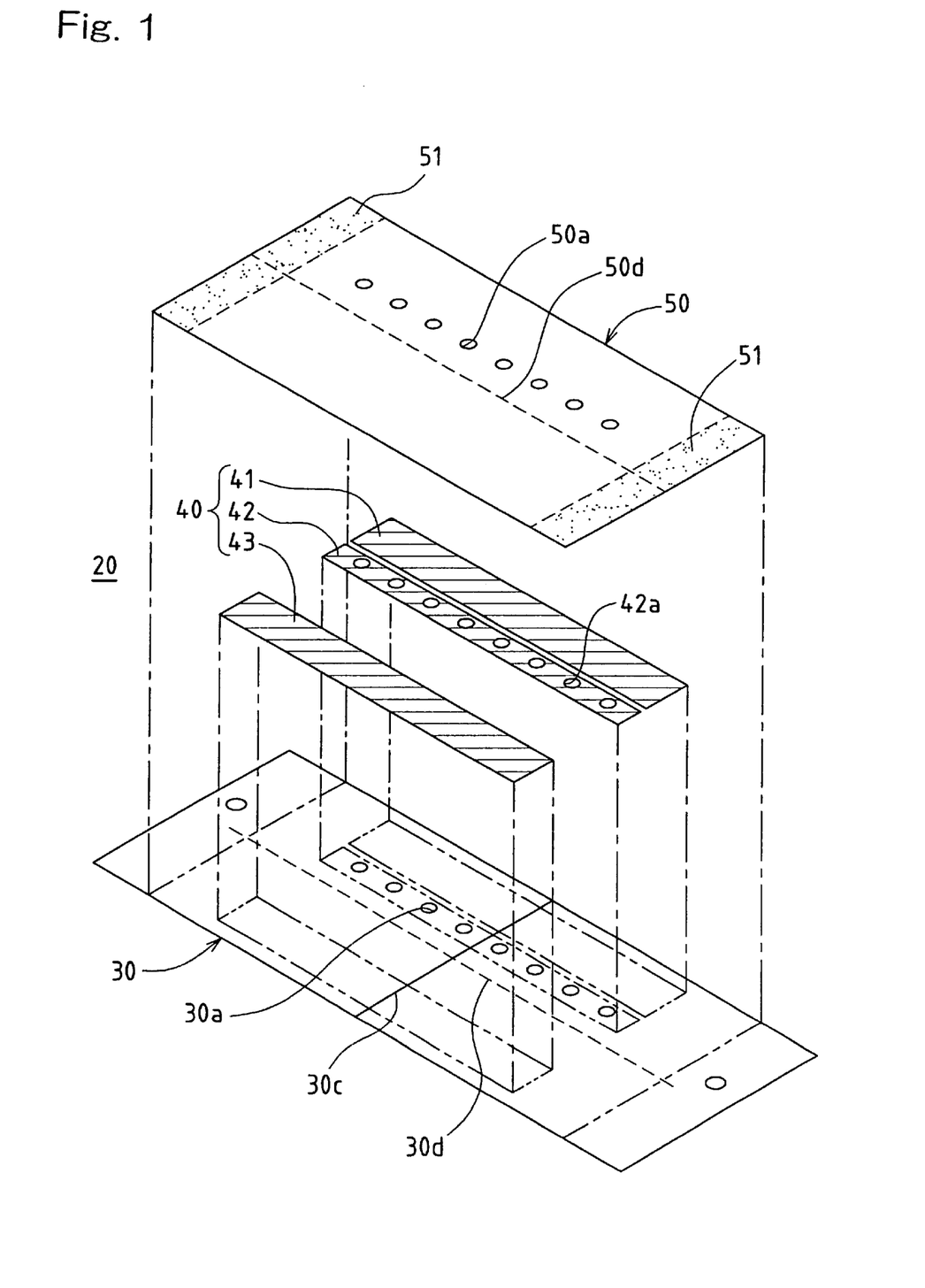
FIG. 1 is an exploded perspective view showing a composition of a preferred connection tape according to the present invention.
Figure 2:
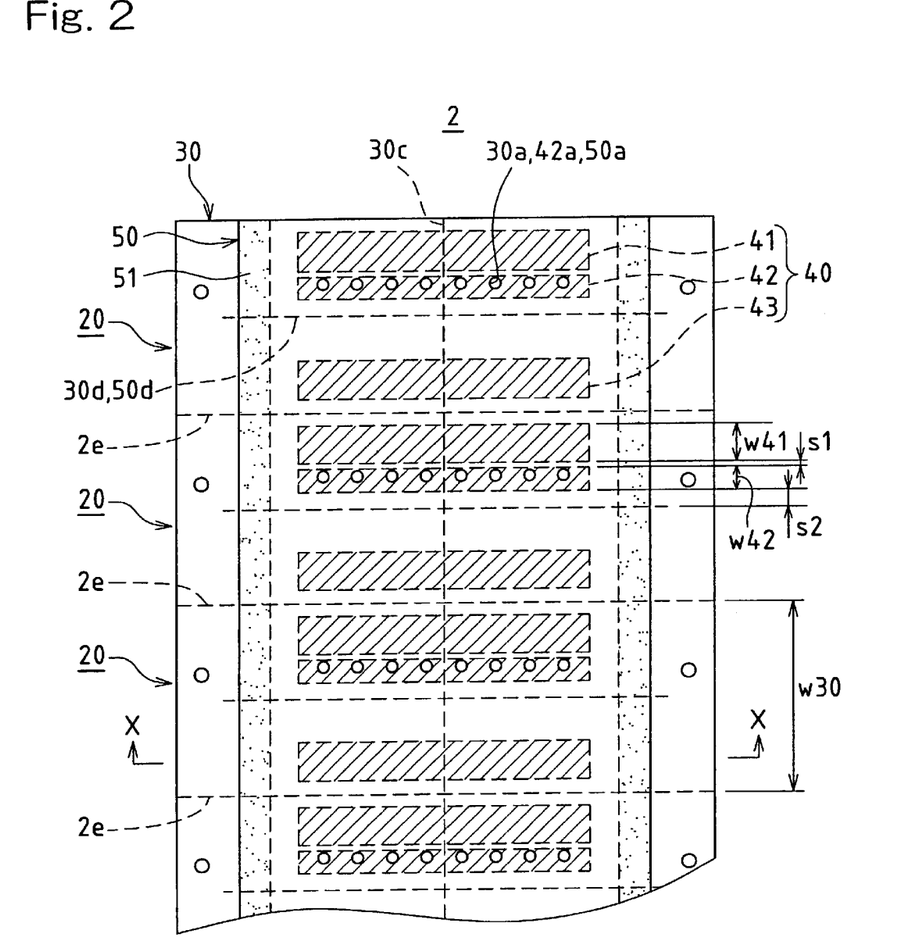
FIG. 2 is a top view of a continuous sheet composed of the connection tapes.
Figure 3:
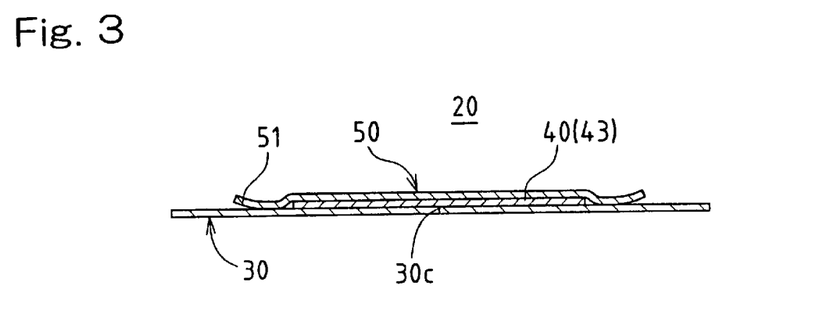
FIG. 3 is a sectional view of the connection tape taken along the line X—X.

FIG. 1 to FIG. 3 illustrate the composition of a preferred connection tape 20 according to the present invention. The connection tape 20 has a sheet-like three-layer structure which looks rectangular in plan view, and comprises a base tape 30, an adhesive tape 40 and a protection tape 50.

The base tape 30 is composed of a PET film whose top surface is subjected to a mold release treatment, and the tape is sectioned in two portions by a straight slit 30c which extends approximately in the middle to divide the tape in half in the longitudinal direction. The adhesive tape 40 is made of a suitably colored polyester film having a thickness of about 50 to 100 $\mu$m. An adhesive is applied to its bottom surface, and this adhesive surface adheres to the top surface of the base tape 30. The adhesive tape 40 comprises three thin long strips divided in parallel to the longitudinal direction, i.e. a first adhesive tape 41, a second adhesive tape 42 and a third adhesive tape 43. The first adhesive tape 41 and the second adhesive tape 42 are juxtaposed with a slim space therebetween. The third adhesive tape 43 is disposed farther away from the second adhesive tape 42.

The protection tape 50 is made of a transparent or semitransparent polyester film which has the identical width and a slightly shorter length compared with the base tape 30. An adhesive is applied to its bottom surface, and this adhesive surface adheres to the top surfaces of the base tape 30 and the adhesive tape 40. In the vicinity of the longitudinal ends, the protection tape 50 includes a certain width of peeling portions 51 obtained by a non-adhesion treatment.

Figure 8:
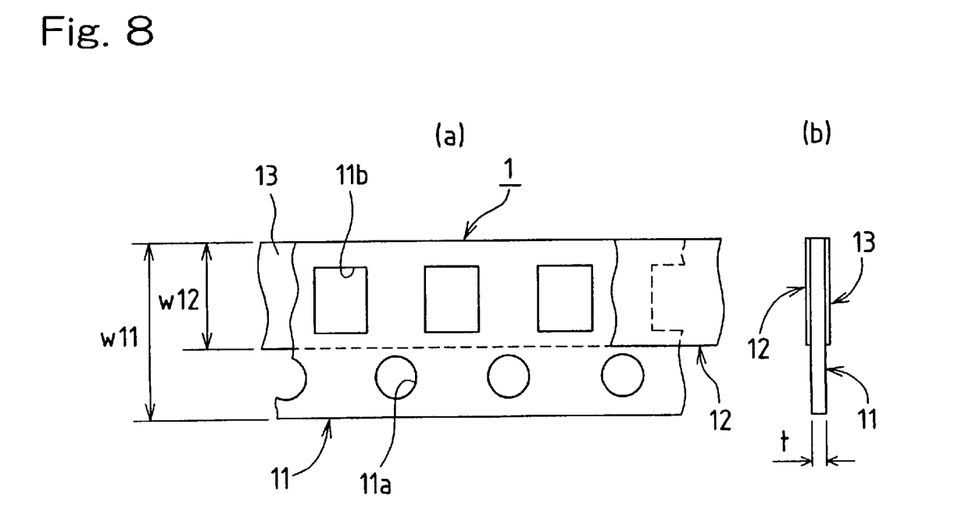

Each of the base tape 30 and the protection tape 50 has a width w30, which is more than twice as large as a width w11 of the carrier tape 11 constituting the square hole-punched carrier tape 1 (see FIG. 8). The width w30 is divided in half by dashed-line perforations 30d, 50d which locate at the same position approximately at the center. The perforations 30d in the base tape 30 are formed except small areas in the longitudinal ends of the base tape 30, while the perforations 50d in the protection tape 50 extend over the entire length of the protection tape 50.

In the adhesive tape 40, the width w41 of the first adhesive tape 41 is nearly identical to the width w12 of the top cover tape 12 constituting the square hole-punched carrier tape 1 (see FIG. 8). The dimension of the width w41, the width w42 of the second adhesive tape 42 and the width s1 of the above-mentioned space, as put together, defines a width equal to the width w11 of the carrier tape 11. The first adhesive tape 41 and the second adhesive tape 42 are disposed in a first half of the base tape 30 which is halved by the perforations 30d, with the second adhesive tape 42 being closer to the perforations 30d. The second adhesive tape 42 is spaced from the perforations 30d by a space s2, which is a little greater than the thickness t of the carrier tape 11 (see FIG. 8).

On the other hand, the third adhesive tape 43 has a width nearly equivalent to the width w12 of the bottom cover tape 13 (the top cover tape 12) which constitutes the square hole-punched carrier tape 1. Namely, its width is approximately equal to the width w41 of the first adhesive tape 41. The third adhesive tape 43 lies in symmetry with respect to the first adhesive tape 41 about the perforations 30d.

Along the position corresponding to the second adhesive tape 42, sprocket holes 30a, 42a, 50a are pierced through the base tape 30, the second adhesive tape 42 and the protection tape 50, respectively, in a pitch and diameter equivalent to that of the sprocket holes 11a formed along a lateral edge of the carrier tape 11.

As illustrated in FIG. 2, the connection tapes 20 are produced in the form of a continuous sheet 2 in which a suitable number of connection tapes continue in a lateral direction, and they are separated one by one when employed for connection of used and new square hole-punched carrier tapes 1. As a cut-off line, perforations 2e run between the connection tapes 20 in the continuous connection tape sheet 2.

By means of the connection tape 20, a pair of used and new square hole-punched carrier tapes 1, 1 can be connected in the manner described below.

Figure 4:
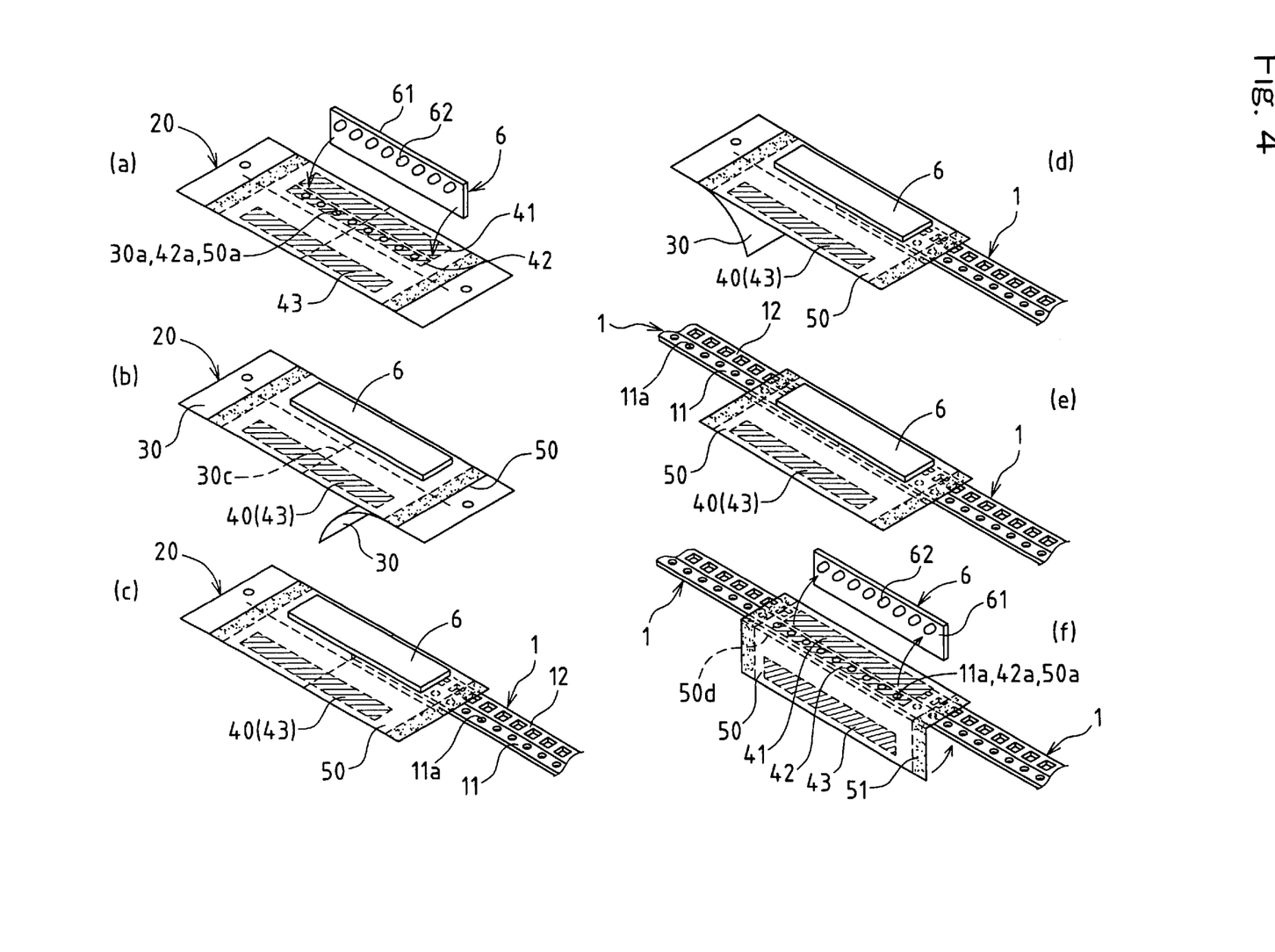
FIG. 4 is a series of illustrations showing, in the order of (a) to (f), the steps of connecting square hole-punched carrier tapes by means of the connection tape.
Figure 5:
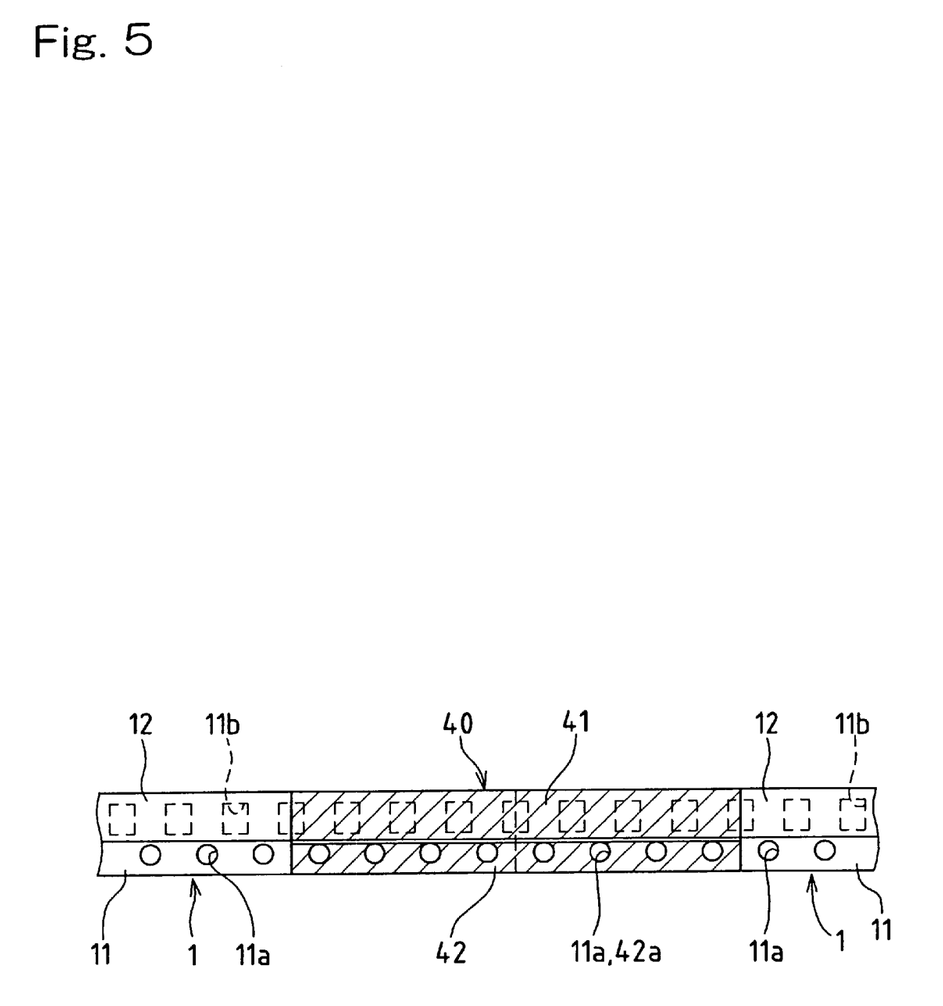
FIG. 5 is a top view of square hole-punched carrier tapes as connected by means of the connection tape.

FIGS. 4(a) to (f) illustrate the connection steps, and FIG. 5 represents the square hole-punched carrier tapes 1, 1 as connected by the connection tape 20.

First of all, reference is made to a jig 6 shown in FIG. 4(a). The jig 6 comprises a long narrow presser plate 61 whose width is nearly the same as or slightly greater than the width wll of the carrier tape 11 as well as a plurality of pins 62 whose outer diameter corresponds to the inner diameter of the sprocket holes 30a, 42a, 50a in the connection tape 20. The pins 62 are implanted in one surface of the presser plate 61, aligned in a line and at the same pitch as the sprocket holes 30a, 42a, 50a. The jig 6 is laid on the top surface of the connection tape 20. Then, the pins 62 are inserted into the sprocket holes 30a, 42a, 50a in the connection tape 20.

Secondly, as shown in FIG. 4(b), a first half of the base tape 30 as sectioned by the slit 30c is peeled off from the connection tape 20, thereby allowing the adhesive tape 40 and the protection tape 50 to expose first halves of their bottom adhesive surfaces.

Thirdly, as shown in FIG. 4(c), a first half of the connection tape 20 is overlapped on the top surface of the trailing end of a used square hole-punched carrier tape 1. At the same time, the pins 62 of the jig 6 which project from the bottom surface of the connection tape 20 are inserted into the sprocket holes 11a in the carrier tape 11, aligning the sprocket holes 11a, 42a, 50a. When the presser plate 61 of the jig 6 is pressed in this condition, the first halves of the first adhesive tape 41 and the second adhesive tape 42 are attached to the top surface of the trailing end of the square hole-punched carrier tape 1. To be specific, the first adhesive tape 41 adheres to the top cover tape 12, and the second adhesive tape 42 adheres to the lateral edge of the carrier tape 11 on the side of the sprocket holes 11a.

In the next step, referring to FIG. 4(d), the remaining second half of the base tape 30 is peeled off to expose second halves of the bottom adhesive surfaces of the adhesive tape 40 and the protection tape 50.

Thereafter, referring further to FIG. 4(e), the leading end of a new square hole-punched carrier tape 1 is abutted against the trailing end of the used square hole-punched carrier tape 1, with the pins 62 of the jig 6 being inserted into the sprocket holes 11a. By pressurizing the presser plate 61 of the jig 6, the second halves of the first adhesive tape 41 and the second adhesive tape 42 are adhered to the top cover tape 12 and the carrier tape 11 of the new square hole-punched carrier tape 1.

After the first adhesive tape 41 and the second adhesive tape 42 are attached across the used and new square hole-punched carrier tapes 1, 1, the jig 6 is detached as shown in FIG. 4(f). Then, the protection tape 50 is bent downwards at the perforations 50d, so as to adhere the third adhesive tape 43 to the bottom cover tapes 13 of the used and new square hole-punched carrier tapes 1, 1. The third adhesive tape 43, which is symmetrical with respect to the first adhesive tape 41 about the perforations 50d as mentioned above, overlaps almost accurately onto the bottom cover tapes 13 simply by folding the protection tape 50.

Thus, with an interposition of the adhesive tape 40 composed of three strips (first adhesive tape 41, second adhesive tape 42, third adhesive tape 43), the used and new square hole-punched carrier tapes 1, 1 are connected on both the top and bottom surfaces. Thereafter, the protection tape 50 is peeled off from both the top and bottom surfaces by pulling the peeling portions 51 in the protection tape 50. The resulting connection state is shown in FIG. 5. In this state, the sprocket holes 11a in the used and new square hole-punched carrier tapes 1, 1 continue at a precise pitch, in alignment with the sprocket holes 42a in the second adhesive tape 42. As a result, no trouble will occur when the used and old square hole-punched carrier tapes 1, 1 are supplied in the connected state to the automatic mounting device, etc. In addition, due to the adhesion of the first adhesive tape 41 across the used and new top cover tapes 12, 12, when surface mount components are taken out of the pocket holes, the top cover tapes 12, 12 peel off without fail and do not cause peeling failure at the connection point.

The above connection process first carries out the adhesion of a used square hole-punched carrier tape 1 to the corresponding first half of the connection tape 20, and then performs adhesion of a new square hole-punched carrier tape 1 to the corresponding second half of the connection tape 20. Alternatively, it is possible to peel off the base tape 30 in the reverse order, according to which a new square hole-punched carrier tape 1 is adhered to the connection tape 20, before a used square hole-punched carrier tape 1 is adhered to the connection tape 20.

As described above, the connection tape 20 of the present invention has following advantages in the relationship between its composition and the manner of its use.

Namely, the base tape 30 has a top surface subjected to a mold release treatment, and is divided in two portions by a straight slit 30c which halves the tape in the longitudinal direction. This enables the base tape 30 not only to peel off easily but also to allow, without restriction, whichever of the used and new square hole-punched carrier tapes 1, 1 to be connected first.

Next, the adhesive tape 40 comprises three separate strips, wherein the first adhesive tape 41, the second adhesive tape 42 and the third adhesive tape 43 can be attached, respectively, to the top cover tape 12, the carrier tape 11 and the bottom cover tape 13, in an independent and non-interfering manner. Therefore, in a mounting operation, the top cover tape 12 and the bottom cover tape 13 can be peeled off from the carrier tape 11 without peeling failure or other trouble.

Besides, the second adhesive tape 42, when attached, has the sprocket holes 42a aligned with the sprocket holes 11a in the carrier tape 11. This avoids partial obstruction of the sprocket holes 11a and ensures smooth supply of the connected square hole-punched carrier tapes 1.

Further, the protection tape 50 can be easily bent backwards at the perforations 50d, which also serve as a line of symmetry with respect to the first adhesive tape 41 and the third adhesive tape 43. According to this structure, with the first adhesive tape 41 being attached to the top cover tape 12, the third adhesive tape 43 can be precisely adhered to the bottom cover tape 13 simply by folding back the protection tape 50.

In addition, due to a space s2 which is provided between the perforations 50d in the protection tape 50 and the second adhesive tape 42 and which is slightly greater than the thickness t of the carrier tape 11, the protection tape 50 can be folded back with an allowance. Preferably, the dimension of the space s2 is adjusted in accordance with the thickness of each tape, the flexural rigidity of the protection tape 50, and the like.

Instead of the perforations 50d mentioned above, the protection tape 50 may be formed with a similar fold line finish by embossing and other means.

Moreover, the protection tape 50 can be peeled off easily by pulling the peeling portions 51 which locate in the vicinity of both ends thereof. The peeling portions 51 can be obtained by not applying an adhesive at the corresponding portions. They can be also formed by applying an adhesive on the entire bottom surface of the protection tape 50 and then laying additional thin cover tapes or the like only on the corresponding portions.

Furthermore, the adhesive tape 40 may have a different color from the square hole-punched carrier tape 1, so that the connection point can be recognized readily and clearly.

In the connection tape 20 of the above embodiment, the base tape 30 has the perforations 30d as well, because, according to the method for manufacturing the connection tapes to be mentioned below, a punching machine penetrates the perforations 30d, 50d, with the base tape 30 and the protection tape 50 overlapped. However, considering that the above-described connection process does not especially require the perforations 30d in the base tape 30, it makes no difference if the manufacturing process is arranged not to make the perforations 30d.

Likewise, the connection tape 20 of the above embodiment comprises the sprocket holes 30a, 42a, 50a piercing through the three layers of the base tape 30, the second adhesive tape 42 and the protection tape 50. According to the connection tapes manufacturing method as hereinafter described, they, too, are provided for the same reason that a punching machine penetrates the sprocket holes 30a, 42a, 50a, with these three layers overlapped. It is advantageous to form the sprocket holes 30a, 42a, 50a through the three layers, when the jig 6 is employed as above. However, it is only the sprocket holes 42a in the second adhesive tape 42 that are necessary in the end. Accordingly, provided that the sprocket holes 11a in the used and new square hole-punched carrier tapes 1 and the sprocket holes 42a in the second adhesive tape 42 are aligned by visual confirmation or the like, the base tape 30 and the protection tape 50 do not necessarily include the sprocket holes 30a, 50a.

The description is now directed to the manufacturing method of the connection tapes according to the present invention.

Figure 6:
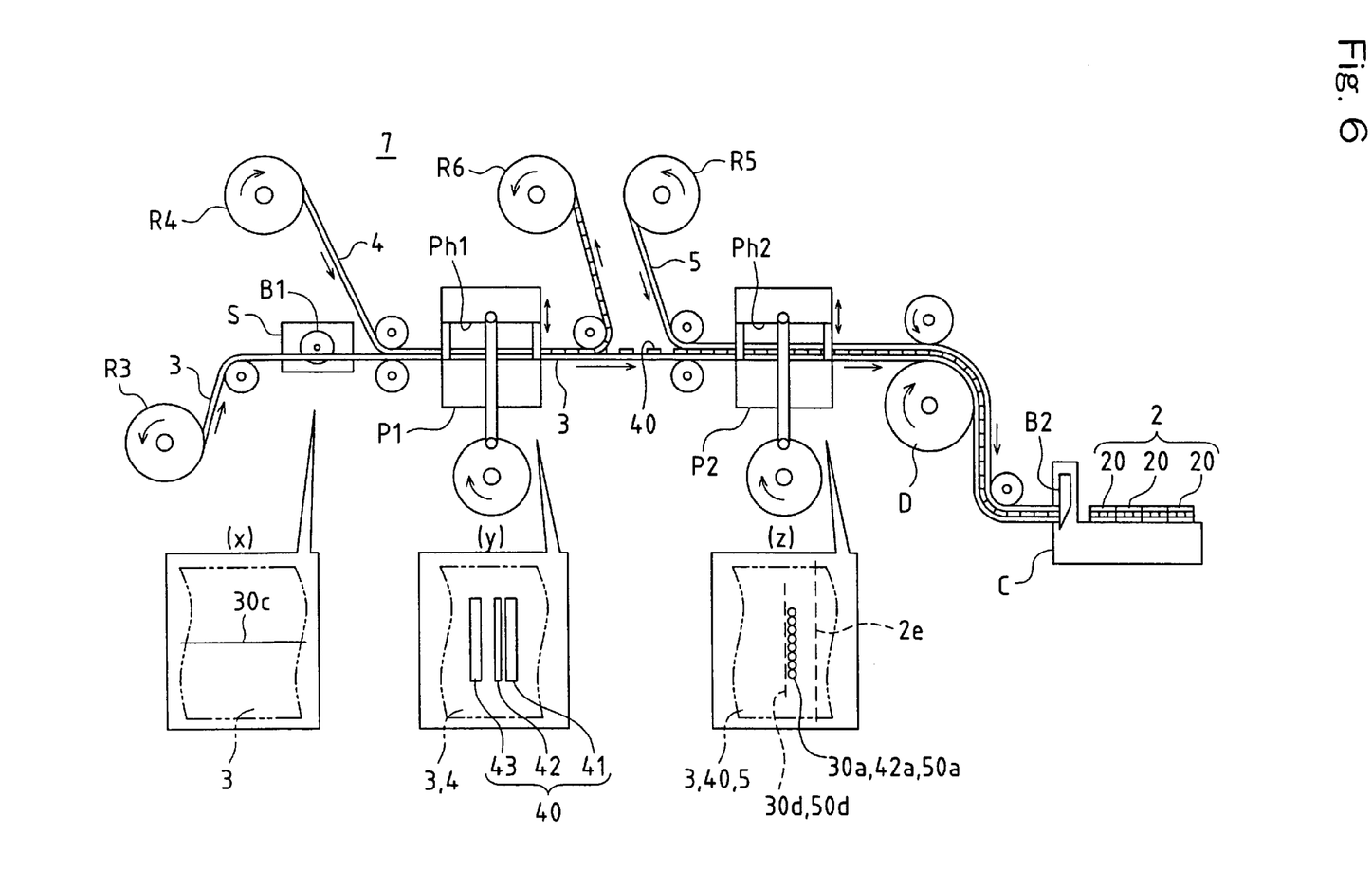
FIG. 6 is a schematic illustration showing the composition of a manufacturing apparatus of the connection tape.

FIG. 6 shows an exemplary structure of a manufacturing apparatus 7 for automatic and continuous manufacture of the connection tapes 20.

The manufacturing apparatus 7 is designed to carry materials supplied from the left side in FIG. 6 to the right side, while successively processing the materials. As the materials, the base tape 30, the adhesive tape 40 and the protection tape 50, as mentioned above, are each used in a long continuous form as a long base tape 3, a long adhesive tape 4 and a long protection tape 5. In the following description, the longitudinal direction means the continuing direction of each long material, and the cross direction means the direction perpendicular to the longitudinal direction.

In the first part of the manufacturing apparatus 7, illustrated in the left side of FIG. 6, there are provided a base tape feed reel R3 for continuously supplying the long base tape 3 and an adhesive tape feed reel R4 for continuously supplying the long adhesive tape 4. The long base tape 3 is fed out from the base tape feed reel R3, passes a slitter S, and is adhered to the long adhesive tape 4 fed out from the adhesive tape feed reel R4. The slitter S is equipped with a disc-shaped rotary blade B1 which rotates along the feeding direction of the long base tape 3. As shown in the illustration (x) in FIG. 6, the rotary blade B1 continuously provides a slit 30c which bisects the width of the long base tape 3.

In the middle part of the manufacturing apparatus 7, a first punching machine P1 serves to punch the long adhesive tape 4. A take-up reel R6 is disposed to peel and reel up scraps of the long adhesive tape 4 punched by the first punching machine P1. A protection tape feed reel R5 continuously supplies the long protection tape 5. By a second punching machine P2, a continuous strip laminated with the long protection tape 5 is formed with the sprocket holes 30a, 42a, 50a, the perforations 30d, 50d as the fold lines, and the perforations 2e as the cut-off line.

The first punching machine P1 is equipped with a punch head Ph1 which is raised and lowered by a crank mechanism. Its up-down stroke is adjusted such that the punch head Ph1 can punch only the long adhesive tape 4 which is the upper element in the two-layer continuous strip obtained by adhesion of the long base tape 3 to the long adhesive tape 4. The blade of the punch head Ph1 is shaped to be capable of punching, in one operation, the profile of the adhesive tape 40 (first adhesive tape 41, second adhesive tape 42 and third adhesive tape 43) constituting the connection tape 20, as given in the illustration (y) in FIG. 6(b).

Similar to the first punching machine P1, the second punching machine P2 is equipped with a punch head Ph2 which is raised and lowered by a crank mechanism. As shown in the illustration (z) in FIG. 6, the punch head Ph2 perforates the three-layer continuous strip composed of the long base tape 3, the punched adhesive tape 40 and the long protection tape 5 attached on a top surface thereof, and thereby simultaneously gives the sprocket holes 30a, 42a, 50a penetrating through the continuous strip, as well as two types of perforations, i.e. the fold line perforations 30d, 50d and the cut-off line perforations 2e. Scraps of the sprocket holes 30a, 42a, 50a are removed upwardly by air suction, etc. through the inside of a thin tube-form blade which punches them out.

In the final part of the manufacturing apparatus 7, illustrated in the right side in FIG. 6, there are disposed a feeding drum D for carrying the long continuous strip in an integrated state, and a cutter C for severing a processed long continuous strip at a predetermined interval.

The feeding drum D is provided with a motor (not shown) and arranged to rotate intermittently in synchronization with the operation of the first punching machine P1 and the second punching machine P2.

The cutter C comprises an up-down blade B2 which ascends and descends intermittently. By means of this cutter C, the long continuous strip processed and produced by the manufacturing apparatus 7, which is composed of the above connection tapes 20 laterally joined as shown in FIG. 2, is cut into a unit of predetermined pieces to give a continuous connection tape sheet 2.

With the use of this manufacturing apparatus 7, the method for manufacturing the connection tapes can be carried out in the following manner.

To begin with, the long base tape 3, having a surface subjected to the mold release treatment and loaded on the base tape feed reel R3, is reeled out, with the treated surface facing upwards. While allowed to pass through the slitter S, the long base tape 3 is formed with the slit 30c which divides its width in half. In the meantime, the long adhesive tape 4 loaded on the adhesive tape feed reel R4 is reeled out, with its adhesive surface facing downwards, and adhered on the top surface of the long base tape 3 formed with the slit 30c.

The thus obtained two-layer continuous strip composed of the long base tape 3 and the long adhesive tape 4 is delivered into the first punching machine P1, where the long adhesive tape 4 is punched to define the profiles of the first adhesive tape 41, the second adhesive tape 42 and the third adhesive tape 43.

The punched scraps of the long adhesive tape 4 are peeled off from the punched two-layer continuous strip and reeled up by the take-up reel R6. Thus obtained is a continuous strip composed of the long base tape 3 and the punched adhesive tape 40.

Then, the long protection tape 5 loaded on the protection tape feed reel R5 is reeled out, with its adhesive surface facing downwards, and attached onto the top surface of the continuous strip composed of the long base tape 3 and the punched adhesive tape 40.

The resulting three-layer continuous strip, composed of the long base tape 3, the punched adhesive tape 40 and the long protection tape 5, is carried into the second punching machine P2, where the three layers are punched simultaneously to form the sprocket holes 30a, 42a, 50a which penetrate at the position corresponding to the second adhesive tape 42, the fold line perforations 30d, 50d and the cut-off line perforations 2e, while punched scraps of the sprocket holes 30a, 42a, 50a are removed.

Thus obtained is a long continuous strip of connection tapes in which the connection tapes 20 are joined in a lateral direction. The long continuous strip is cut into a unit of predetermined pieces of connection tapes 20 to give a continuous connection tape sheet 2.

The above manufacturing method of the connection tapes enables continuous and efficient production of the connection tape 20 of the present invention.

Industrial Applicability

As described above, the present invention provides a connection tape for square hole-punched carrier tapes used in taping of electric components such as resistors and capacitors to be mounted on the surface of a printed circuit board. The connection tape is useful for connecting ends of square hole-punched carrier tapes. It is particularly suitable when the connected square hole-punched carrier tapes are supplied into the automatic mounting device.

What is claimed is:

1. A connection tape for square hole-punched carrier tapes used to connect ends of square hole-punched carrier tapes each comprising a carrier tape formed with a plurality of sprocket holes along a lateral edge thereof and top and bottom cover tapes respectively adhered to top and bottom surfaces of the carrier tape, without obstructing the sprocket holes, which connection tape comprises a base tape whose top surface is subjected to a mold release treatment and which is provided with a slit extending approximately in a middle thereof and dividing the tape in half in the longitudinal direction, an adhesive tape whose bottom surface is an adhesive surface and which is adhered on the top surface of the base tape by the adhesive surface, and a protection tape whose bottom surface is an adhesive surface and which is adhered on the top surfaces of the base tape and the adhesive tape by the adhesive surface, wherein at least the protection tape has a fold line which divides its width in half, wherein the adhesive tape comprises a first adhesive tape which can adhere to the top cover tape, a second adhesive tape which can adhere over the top of the sprocket holes in the carrier tape without interfering with the top cover tape, and a third adhesive tape which can adhere to the bottom cover tape, the first adhesive tape and the second adhesive tape being disposed in a first half as sectioned by the fold line, with the second adhesive tape being closer to the fold line, and the third adhesive tape locating in line symmetry with the first adhesive tape about the fold line, at least the second adhesive tape including a plurality of sprocket holes whose pitch and diameter is the same as that of the sprocket holes in the square hole-punched carrier tape.

2. A connection tape for square hole-punched carrier tapes according to claim 1, wherein a peeling portion subjected to a non-adhesion treatment is provided in a part of the vicinity of each end of the protection tape.

3. A method for manufacturing connection tapes for square hole-punched carrier tapes, which comprises:

a step of providing a long base tape whose top surface is subjected to a mold release treatment and which is provided with a slit dividing its width in half, adhering an adhesive surface of a long adhesive tape to the top surface of the long base tape, punching the long adhesive tape to give profiles of a first adhesive tape, a second adhesive tape and a third adhesive tape which together constitute an adhesive tape of the connection tape, and peeling off each punched scrap, a step of adhering an adhesive surface of a long protective tape on a top surface of a resulting two-layer continuous strip composed of the long base tape and the punched adhesive tape in order to form a three-layer continuous strip, punching the three-layer continuous strip to give a plurality of sprocket holes for the connection tape which penetrate at a position corresponding to the second adhesive tape, a plurality of perforations as a fold line of the connection tape and a plurality of perforations as a cut-off line between connection tapes, and removing scraps of the sprocket holes, and a step of cutting a resulting long continuous strip of connection tapes into a unit of predetermined pieces of connection tapes to produce connection tapes in the form of a continuous sheet.

* * * * *